(12) United States Patent
Masaoka

(10) Patent No.: US 6,956,377 B2
(45) Date of Patent: Oct. 18, 2005

(54) DISCONNECTION DETECTION APPARATUS

(75) Inventor: Hiroaki Masaoka, Mie (JP)

(73) Assignee: Sumitomo Wiring Systems, Inc., Mie (JP)

( * ) Notice: Subject to any disclaimer, the term of this patent is extended or adjusted under 35 U.S.C. 154(b) by 230 days.

(21) Appl. No.: 10/210,662

(22) Filed: Aug. 1, 2002

(65) Prior Publication Data

US 2003/0030447 A1 Feb. 13, 2003

(30) Foreign Application Priority Data

Aug. 2, 2001 (JP) ........................................ 2001-234790

(51) Int. Cl.[7] .......................... G01R 31/00; G08B 21/00
(52) U.S. Cl. ........................ 324/522; 324/500; 340/641
(58) Field of Search ................................. 324/522, 526, 324/514, 500, 556; 315/130, 132, 135–136; 340/641, 642, 660

(56) References Cited

U.S. PATENT DOCUMENTS

| | | | | |
|---|---|---|---|---|
| 4,291,302 A | * | 9/1981 | King et al. ................... | 340/642 |
| 4,315,196 A | * | 2/1982 | Kitayama .................... | 315/132 |
| 4,639,611 A | * | 1/1987 | Sticher ....................... | 307/117 |
| 5,886,543 A | * | 3/1999 | Moody ......................... | 327/77 |
| 6,209,913 B1 | * | 4/2001 | Ishikawa et al. ............ | 280/755 |
| 6,631,159 B1 | * | 10/2003 | Morris ........................ | 375/219 |

FOREIGN PATENT DOCUMENTS

| | | |
|---|---|---|
| JP | 10116552 A | 5/1998 |
| JP | 10257662 A | 9/1998 |

* cited by examiner

*Primary Examiner*—Anjan Deb
*Assistant Examiner*—Jeff Natalini
(74) *Attorney, Agent, or Firm*—Oliff & Berridge, PLC

(57) ABSTRACT

A detection part (B), of a disconnection detection apparatus (1A), detects an open destruction of a detection resistor. An emitter of a transistor (Q5) is connected to an upstream end of a detection resistor (R1) through a diode (connected forward) (D2). A base of the transistor (Q5) is connected to a downstream end of the detection resistor (R1) through a resistor (R8). A collector of the transistor (Q5) is connected to an upstream side of a resistor (R4) of a determination part (3). In the detection part (B), the transistor (Q5) is turned on and off according to the difference in the potential between both ends of the detection resistor (R1). In an open destruction detection state, generated when the transistor (Q5) is ON, electric current supplied by the power supply 4 is fed to the determination part (3) through the transistor (Q5) as a detection result indicating that an open destruction has occurred.

4 Claims, 6 Drawing Sheets

DISCONNECTION DETECTION APPARATUS

CROSS-REFERENCE TO RELATED APPLICATIONS

This application claims priority to Japanese Patent Application No. JP 2001-234790 filed Aug. 2, 2001, which application is herein expressly incorporated by reference.

FIELD OF THE INVENTION

The present invention relates to a disconnection detection apparatus connectedly interposed between a power supply and a load (stop lamp, high-mount stop lamp, tail lamp, etc.). The apparatus detects a disconnection of a feeding path to the load by detecting a voltage drop at a detection resistance mounted on the feeding path interposed between the load and the power supply.

BACKGROUND OF THE INVENTION

FIG. 5 is a schematic view showing the construction of a conventional disconnection detection apparatus. FIG. 6 is a circuit diagram showing main portions of the disconnection detection apparatus shown in FIG. 5.

As shown in FIGS. 5 and 6, a disconnection detection apparatus 100 is interposed between a switch SW and a load F of a feeding path 2. The feeding path has a power supply 4, a fuse H, the switch SW, and the load F connected in series with one another. Let it be supposed that the load F is a lamp.

The disconnection detection apparatus 100 has a pair of terminals P1 and P2 connected to a wire such as a wire harness extending from the power supply 4 and a wire such as a wire harness extending from the load F, respectively. A detection resistor R1 is interposed and connected between the terminals P1 and P2. A detection part (first detection part) detects a disconnection of the feeding path 2, according to a decrease of a voltage drop at the detection resistor R1 compared to a voltage drop which may occur in normal operation. A determination part 3 determines whether the feeding path 2 has a disconnection, based on a detection result supplied by the detection part A. A warning lamp 5 informs an operator of the disconnection of the feeding path 2. A driving part 7 drives the warning lamp 5. A control part 9 controls the driving part 7, based on a determination result supplied by the determination part 3.

As shown in FIG. 6, the detection part A includes resistors R2 and R3, a transistor (for example, PNP type) Q1 and Q2, and a capacitor C1. In the detection part A, an electric wire is branched at an upstream end of the detection resistor R1 and is connected in series with the resistor R2, the emitter-collector of the transistor Q1, and a resistor R3. A wire extending from the resistor R3 is grounded through a diode (forward connection) D1. An electric wire is branched at a downstream end of the detection resistor R1 and is connected with the emitter-collector of the transistor Q2. The emitter-collector of the transistor Q2 is connected with the anode of the diode D1 through the determination part 3 which will be described later. A base of the transistor Q1 is connected to the collector and a base of the transistor Q2. The noise-removing capacitor C1 is connectedly interposed between the downstream end of the detection resistor R1 and a downstream end of the resistor R2.

The detection part A and the detection resistor R1 form a current Miller circuit. As will be described later, the transistor Q2 is turned on and off according to a change of an electric potential (namely, electric potential of emitter of transistor Q2) at the downstream end of the detection resistor R1. In a disconnection detection state, that is generated when the transistor Q2 is on, electric current supplied by the power supply 4 is fed to the determination part 3 through the transistor Q2 as a detection result indicating that a disconnection has occurred.

As shown in FIG. 6, in the determination part 3, a base of a transistor (for example, NPN type) Q3 is connected to the collector of the transistor Q2 through a resistor R4. Further an emitter of the transistor Q3 is branch-connected to the base of the transistor Q3 through a resistor 5 and to the anode of the diode D1. Further the collector of the transistor Q3 is connected to the terminal P1 through voltage-dividing resistors R6 and R7. In addition, a noise-removing capacitor C2 is connected in parallel with the resistor R5. Further in the determination part 3, a base of a transistor (for example, PNP type) Q4 is connected to a node between resistors R6 and R7. An emitter of the transistor Q4 is connected to the terminal P1. A collector of the transistor Q4 is connected to the control part 9.

As will be described later, the transistor Q3 is turned on and off by the electric current fed from the transistor Q2 of the detection part A as a detection result which indicates that a disconnection has occurred. In a disconnection-determined state, which is generated when the transistor Q3 is on, the electric current supplied by the power supply 4 is fed to the control part 9 through the transistor Q4 as a determination result which indicates that the feeding path 2 has been determined to have a disconnection.

Upon receipt of the electric current, which indicates that the feeding path 2 has been determined as having a disconnection from the determination part 3, the control part 9 turns on the warning lamp 5 through the driving part 7.

The operation of the disconnection detection apparatus 100 is described below. Let it be supposed that the switch SW is ON. In a normal operation in which a load current supplied by the power supply 4 is grounded via the fuse H, the switch SW, the detection resistor R1, and the load F, the electric potential of the emitter of the transistor Q2 drops below a threshold because a voltage drop at the detection resistor R1 is caused by the flow of the load current therethrough. Thus the voltage between the emitter and base of the transistor Q2 drops below an ON-voltage, and the transistor Q2 is turned off. In this case, the transistors Q3 and Q4 are kept in an off state, and the electric current which indicates that the feeding path 2 has been determined to have a disconnection is not fed from the determination part 3 to the control part 9. Therefore the control part 9 does not operate and the warning lamp 5 does not turn on.

When the feeding path 2 has a disconnection (normal disconnection of feeding path 2, for example, disconnection of a wire at downstream side of terminal P2), the load current does not flow through the detection resistor R1. Thus no voltage drop occurs in the detection resistor R1. That is, the voltage of detection resistor R1 drops below the voltage drop threat in normal operation. In this case, the electric potential of the emitter of the transistor Q2 is increased to a supply potential. Further the voltage between the emitter and base of the transistor Q2 rises over the ON-voltage, and the transistor Q2 is turned on (disconnection is detected). Thereby the electric current supplied by the power supply 4 flows to the ground as a result of detection of disconnection through the detection resistor R1, the transistor Q2, the resistors R4 and R5, and the diode D1. Due to a voltage drop at the resistor R5, which is caused by the flow of the electric current therethrough, the voltage between the emitter and base of the transistor Q3 rises. As a result, the transistor Q3 is turned on, determining that disconnection has occurred, and the resistors R7 and R6 pass electric current therethrough. Due to the voltage-dividing resistance of the resistors R7 and R6, the voltage between the base and the emitter of the transistor Q4 rises. As a result, the transistor Q4 is turned on, and the electric current supplied by the power supply 4 is fed to the control part 9 through the transistor Q4. Upon receipt of the electric current, the control part 9 drives the warning lamp 5 through the driving part 7.

To detect the disconnection accurately and prevent a malfunction from occurring, in the disconnection detection apparatus 100, it is necessary to increase the value of the detection resistor R1 and the voltage drop at the detection resistor R1. To make the disconnection detection apparatus 100 compact and reduce the cost, it is also necessary to reduce an allowable loss of the detection resistor R1.

However, in the case where the above-described two conditions are satisfied, an open destruction, electrically unconductive at the detection resistor R1, may occur. That is, if the feeding path 2 is short-circuited with a peripheral member at a point G (shown in FIG. 6), a short-circuit current supplied by the power supply 4 and grounded through the fuse H, the switch SW, the detection resistor R1, and the short-circuit point G does not flow through the load F. Therefore the load current short-circuited is higher than the load current not short-circuited. In this case, when the resistance value of the detection resistor R1 is set to a large value for the above-described reason, the short-circuited current is suppressed and will not become high. In the case where the short-circuited current flows through the feeding path 2, it takes a long time for fusion of the fuse H. Thus the short-circuited current flows through the detection resistor R1 for a long time. Further since the resistance value of the detection resistor R1 is set to a large value, a large amount of heat is generated at the detection resistor R1. On the other hand, in the case where the allowable loss of the detection resistor R1 is set to a small value for the above-described reason, the amount of the generated heat exceeds the allowable loss and the open destruction occurs at the detection resistor R1.

However, in the state where the detection resistor R1 has the open destruction, the downstream end of the detection resistor R1 has the ground potential, and the emitter potential of the transistor Q2 is kept below the threshold, and the transistor Q2 is kept in an off state. Thus the detection part A does not detect the open destruction. Accordingly the disconnection detection apparatus 100 has a disadvantage that the open destruction which has occurred at the detection resistor R1 cannot be detected.

SUMMARY OF THE INVENTION

The present invention overcomes the above-described problem. Accordingly, it is an object of the present invention to provide a disconnection detection apparatus which not only detects a disconnection of a feeding path but also detects an open destruction which has occurred at a detection resistor.

To achieve the object, a disconnection detection apparatus has a first detection resistor mounted on a first feeding path that extends from a power supply to a first load. A first detection part detects a disconnection of the first feeding path according to a decrease of a voltage drop at the first detection resistor compared with a voltage drop the first detection resistor during normal operation. A second detection part detects an open destruction of the first detection resistor according to an increase of the voltage drop at the first detection resistor compared with the voltage drop the first detection resistor during normal operation.

The disconnection detection apparatus further includes a warning lamp. A first control part controls the lighting of the warning lamp by a predetermined lighting operation when the first detection part detects the disconnection. A second control part controls the lighting of the warning lamp by a second predetermined lighting operation when the second detection part detects the open destruction.

The disconnection detection apparatus further includes a second detection resistor mounted on a second feeding path which extends from the power supply to a second load. A third detection part detects a disconnection of the second feeding path according to a decrease of a voltage drop at the second detection resistor compared with a voltage drop at the second detection resistor during normal operation. A fourth detection part detects an open destruction of the second detection resistor according to an increase of the voltage drop at the second detection resistor compared with the voltage drop the second detection resistor during normal operation. In this construction, the first control part turns on the warning lamp by the first predetermined lighting operation when the first detection part detects the disconnection of the first feeding path. The first control part turns on the warning lamp by the first predetermined lighting operation when the third detection part or the fourth detection part detects the disconnection of the second feeding path or the open destruction of the second detection resistor. The second control part turns on the warning lamp by the second predetermined lighting operation when the second detection part detects the open destruction of the first detection resistor. The second control part turns on the warning lamp by the second predetermined lighting operation when the third detection part or the fourth detection part detects the disconnection of the second feeding path or the open destruction of the second detection resistor.

The disconnection detection apparatus further includes a first switch to turn on and off a load current to be supplied to the first load from the power supply. A second switch turns on and off a load current to be supplied to the second load from the power supply.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
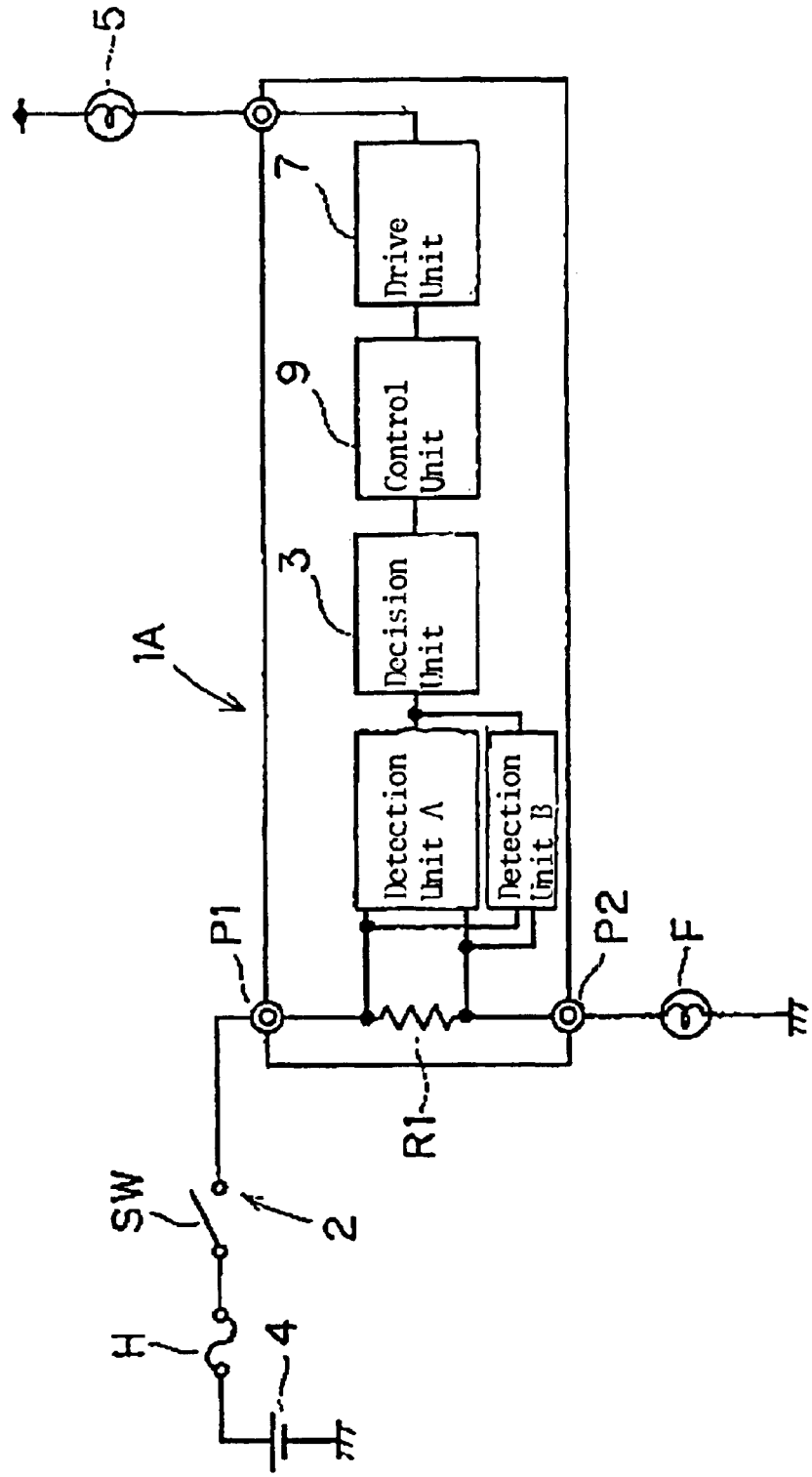
FIG. 1 is a schematic view showing the construction of a disconnection detection apparatus according to a first embodiment of the present invention.
Figure 2:
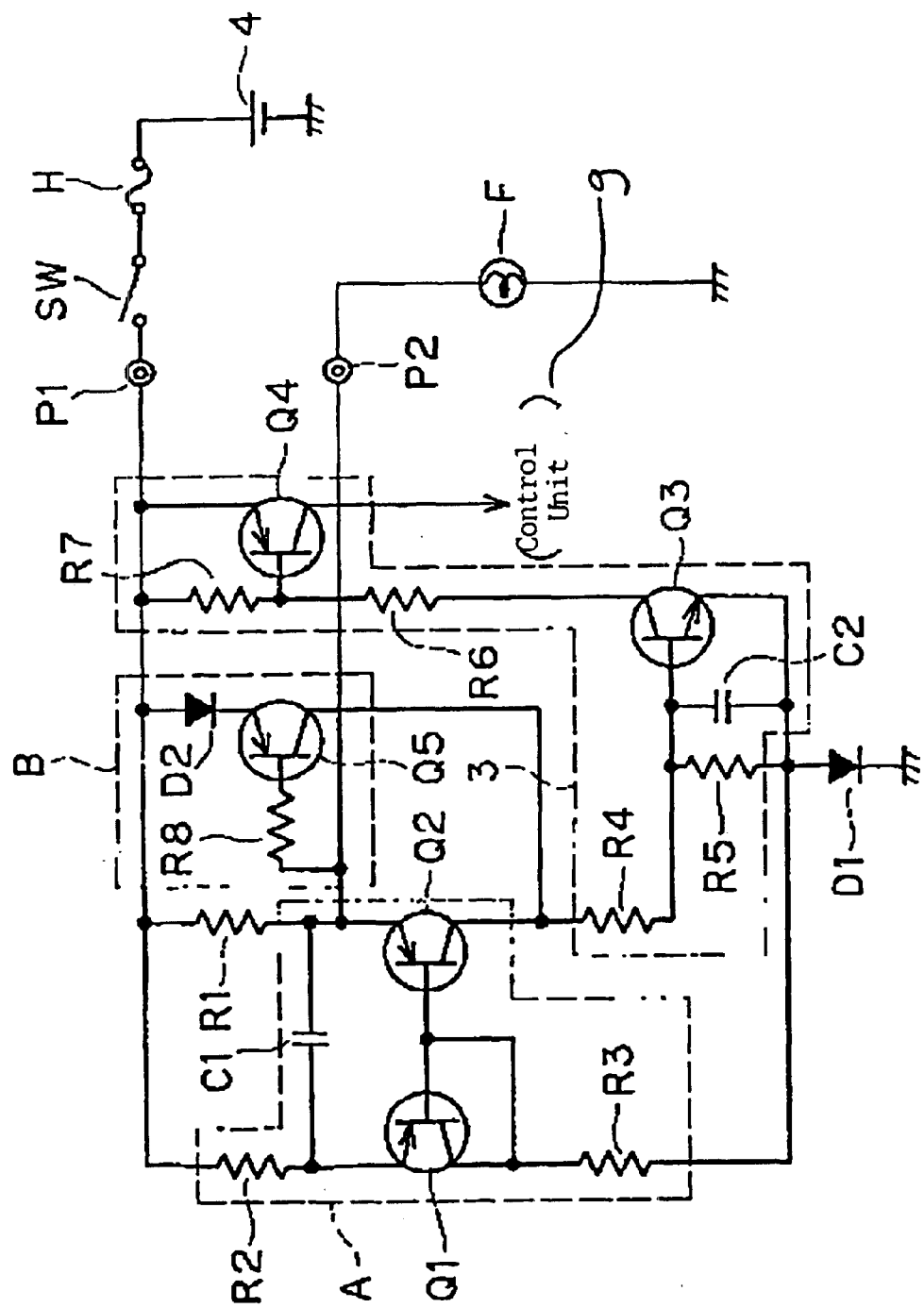
FIG. 2 is a circuit diagram showing main portions of the disconnection detection apparatus shown in FIG. 1.

FIG. 1 is a schematic view showing the construction of a disconnection detection apparatus according to a first embodiment of the present invention. FIG. 2 is a circuit diagram showing main portions of the disconnection detection apparatus shown in FIG. 1.

As shown in FIGS. 1 and 2, in addition to the parts of the conventional disconnection detection apparatus 100, a disconnection detection apparatus 1A of the first embodiment includes a detection part B (second detection part) which detects an open destruction of a detection resistor R1 according to an increase of a voltage drop at the detection resistor R1 compared to a voltage drop at the detection resistor R1 during normal operation. A detection result supplied by the detection part B is sent to a determination part 3. The determination part 3 detects whether a disconnection has occurred in a feeding path 2 and whether an open destruction has occurred at the detection resistor R1. The same parts of the first embodiment as those of the conventional disconnection detection apparatus 100 are denoted by the reference numerals of the conventional disconnection detection apparatus 100, and their description is omitted. The description of the first embodiment is centered on the detection part B.

As shown in FIG. 2, in the detection part B, an emitter of a transistor (for example, PNP type) Q5 is connected to an upstream end of the detection resistor R1 through a diode (connected forward) D2. Further a base of the transistor Q5 is connected to a downstream end of the detection resistor R1 through a resistor R8, and a collector of the transistor Q5 is connected to an upstream side of a resistor R4 of the determination part 3. As will be described later, in the detection part B, the transistor Q5 is turned on and off according to the difference in the potential between both ends of the detection resistor R1. In an open destruction detection state, generated when the transistor Q5 is ON, electric current supplied by the power supply 4 is fed to the determination part 3 through the transistor Q5 as a detection result indicating that an open destruction has occurred.

The value of each of the detection resistor R1 and the resistor R2 and R3 is set such that the transistors Q2 and Q5 are not turned on because of a voltage drop at the detection resistor R1 during normal operation. More specifically, the value of the detection resistor R1 is set to 0.1 Ω when the voltage of the power supply 4 is 12V. A stop lamp has the load F of 21 W/12V. The value of the detection resistor R1 is set to 0.3 Ω when the voltage of the power supply 4 is 12V and a tail lamp has the load F of 21 W/12V. The value of each of the resistors R2 and R3 is set appropriately according to the value of the detection resistor.

The operation of the disconnection detection apparatus 1A is described below. Let it be supposed that the switch SW is ON. In a normal operation in which a load current supplied by the power supply 4 is grounded via the fuse H, the switch SW, the detection resistor R1, and the load F, the transistor Q2 is not turned on but kept off due to a voltage drop at the detection resistor R1 caused by the flow of the load current therethrough, as in the case of the conventional disconnection detection apparatus 100. In this case, the transistors Q3 and Q4 are kept off. The electric current that indicates that the feeding path 2 has been determined to have a disconnection is not fed from the determination part 3 to the control part 9. Therefore the control part 9 does not operate and a warning lamp 5 does not turn on.

When the feeding path 2 has a disconnection (for example, a normal disconnection), voltage drop does not occur in the detection resistor R1. Therefore the electric potential of the base of the transistor Q5 is kept at almost the same electric potential as that of the power supply and is kept off. However, the transistor Q2 is turned on as in the case of the conventional disconnection detection apparatus 100. Thus the warning lamp 5 is turned on as in the case of the conventional disconnection detection apparatus 100.

When an open destruction occurs at the detection resistor R1, the detection resistor R1 has an electrically open state (nonconductive state). Thus the upstream end of the detection resistor R1 is kept at the potential of the power supply and the downstream end of the detection resistor R1 has the ground potential. Thus, the voltage drop at the detection resistor R1 is kept at a voltage equivalent to the supply voltage increase of voltage drop at the detection resistor R1 compared with voltage drop threat during normal operation. In this state, because the electric potential of the emitter of the transistor Q2 drops to the ground potential, the transistor Q2 is turned off. On the other hand, because the voltage drop at the detection resistor R1 is equivalent (higher than ON-voltage) to the supply voltage, the transistor Q5 is turned on. Thus, the electric current supplied by the power supply 4 flows to the ground via the diode D2, the transistor Q5, the resistors R4 and R5, and the diode D1. Similarly the transistors Q3 and Q4 are turned on, due to a normal disconnection of the feeding path due to the voltage drop at the resistor R5 caused by the flow of the electric current therethrough. The electric current supplied by the power supply 4 is fed to the control part 9 through the transistor Q4. Upon receipt of the electric current, the control part 9 turns on the warning lamp 5 through the driving part 7, similar to a detection of a normal disconnection of the feeding path.

The disconnection detection apparatus 1A, having the above-described construction, has the detection part B which detects the disconnection according to the difference in the potential between both ends of the detection resistor R1. Therefore it is possible to appropriately detect the open destruction which has occurred at the detection resistor R1, thereby informing a driver of the open destruction. Further since the detection part B is constructed of one transistor Q5, one resistor R8, and one diode D2, the detection part B can be easily constructed.

Figure 3:
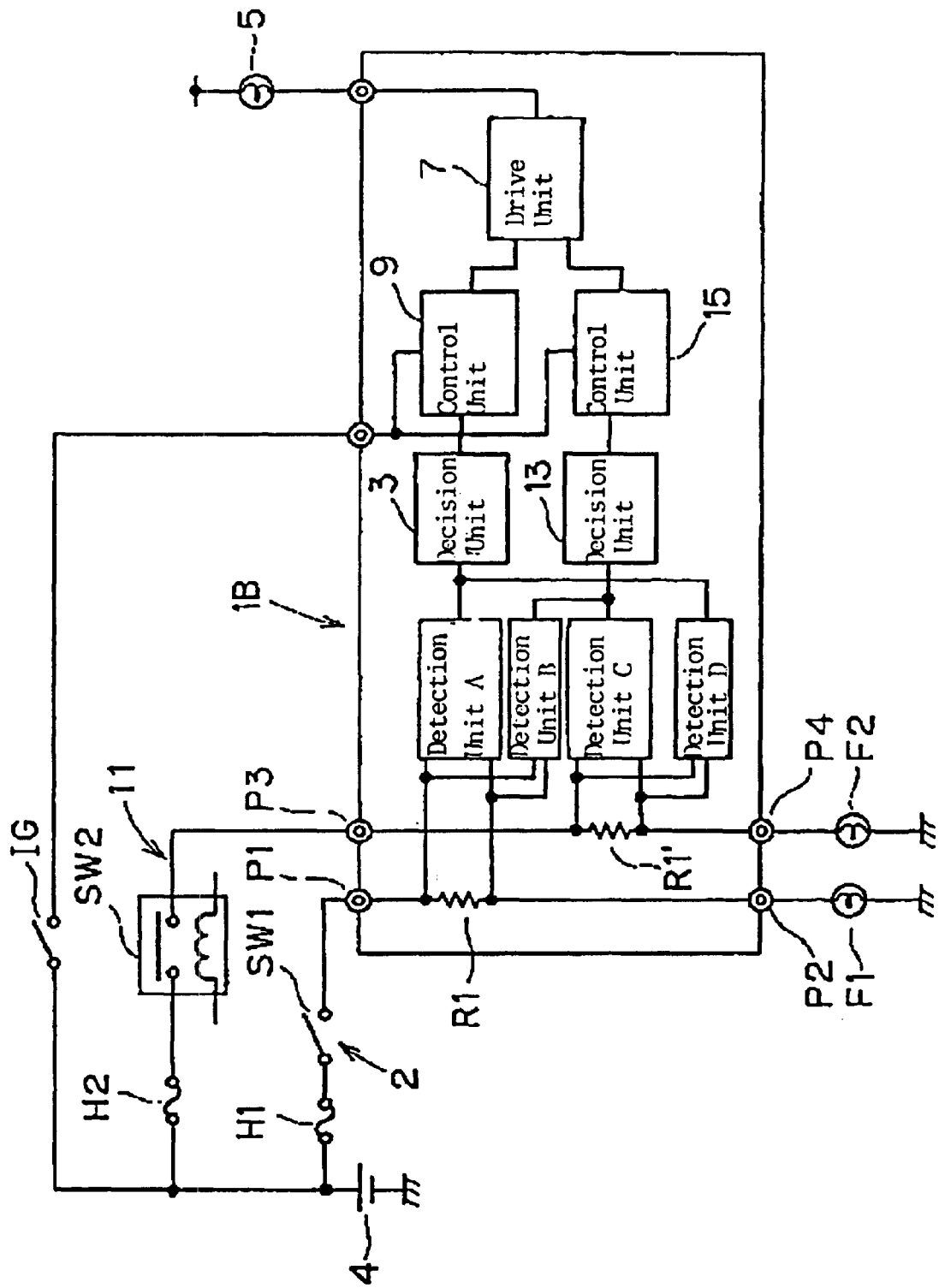
FIG. 3 is a schematic view showing the construction of a disconnection detection apparatus according to a second embodiment of the present invention.
Figure 4:
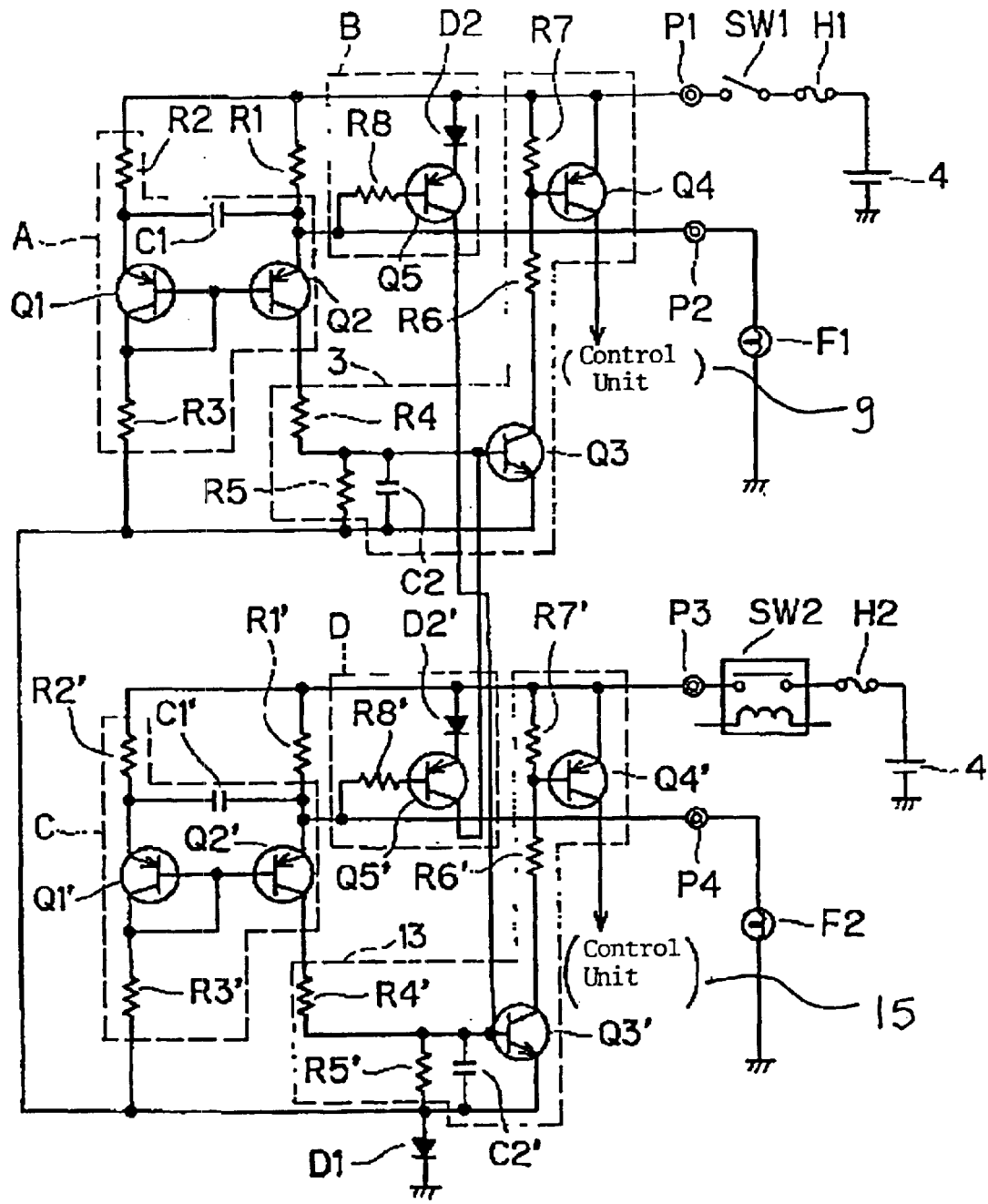
FIG. 4 is a circuit diagram showing main portions of the disconnection detection apparatus shown in FIG. 3.
Figure 5:
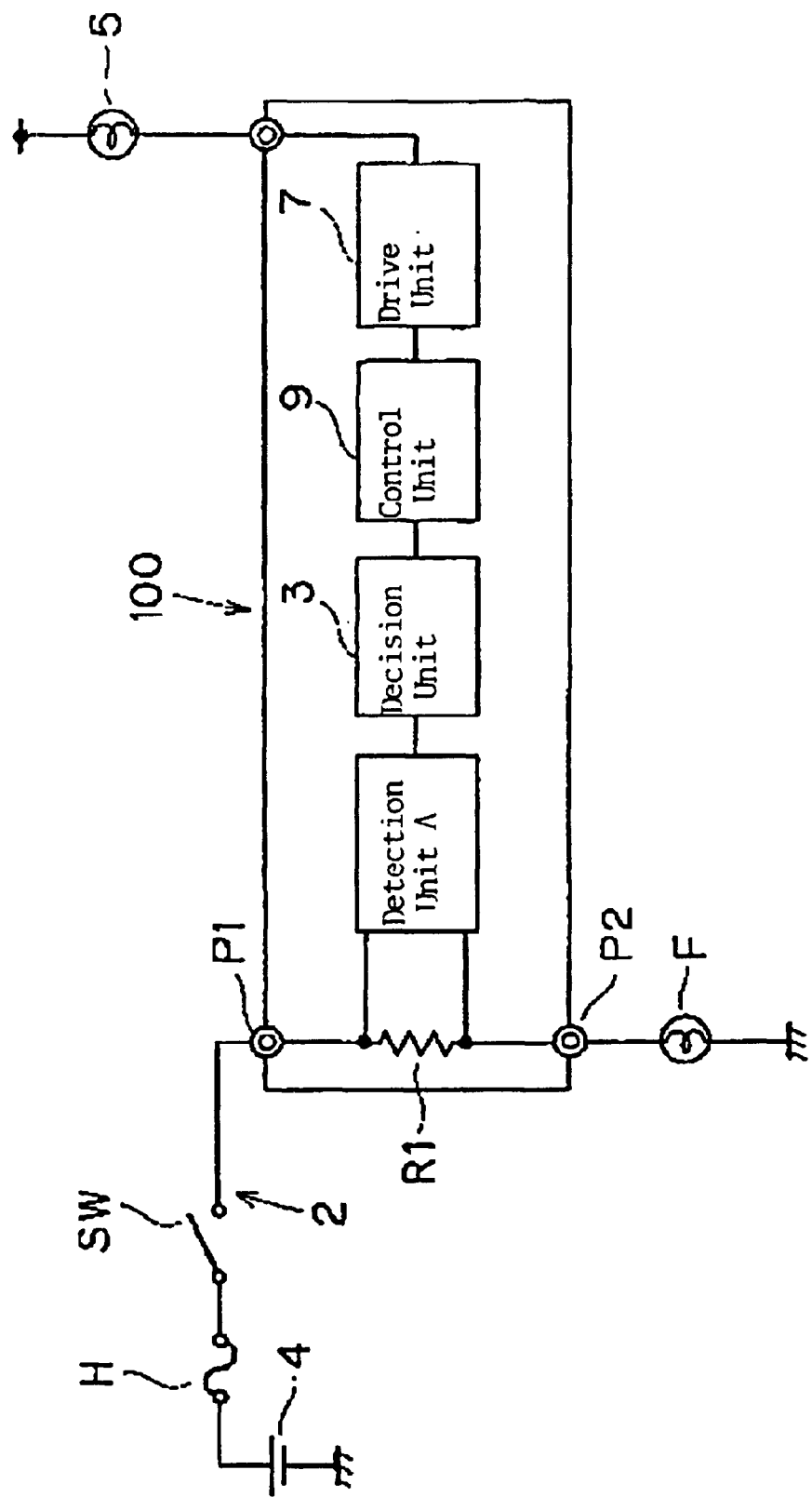
FIG. 5 is a schematic view showing the construction of a conventional disconnection detection apparatus.
Figure 6:
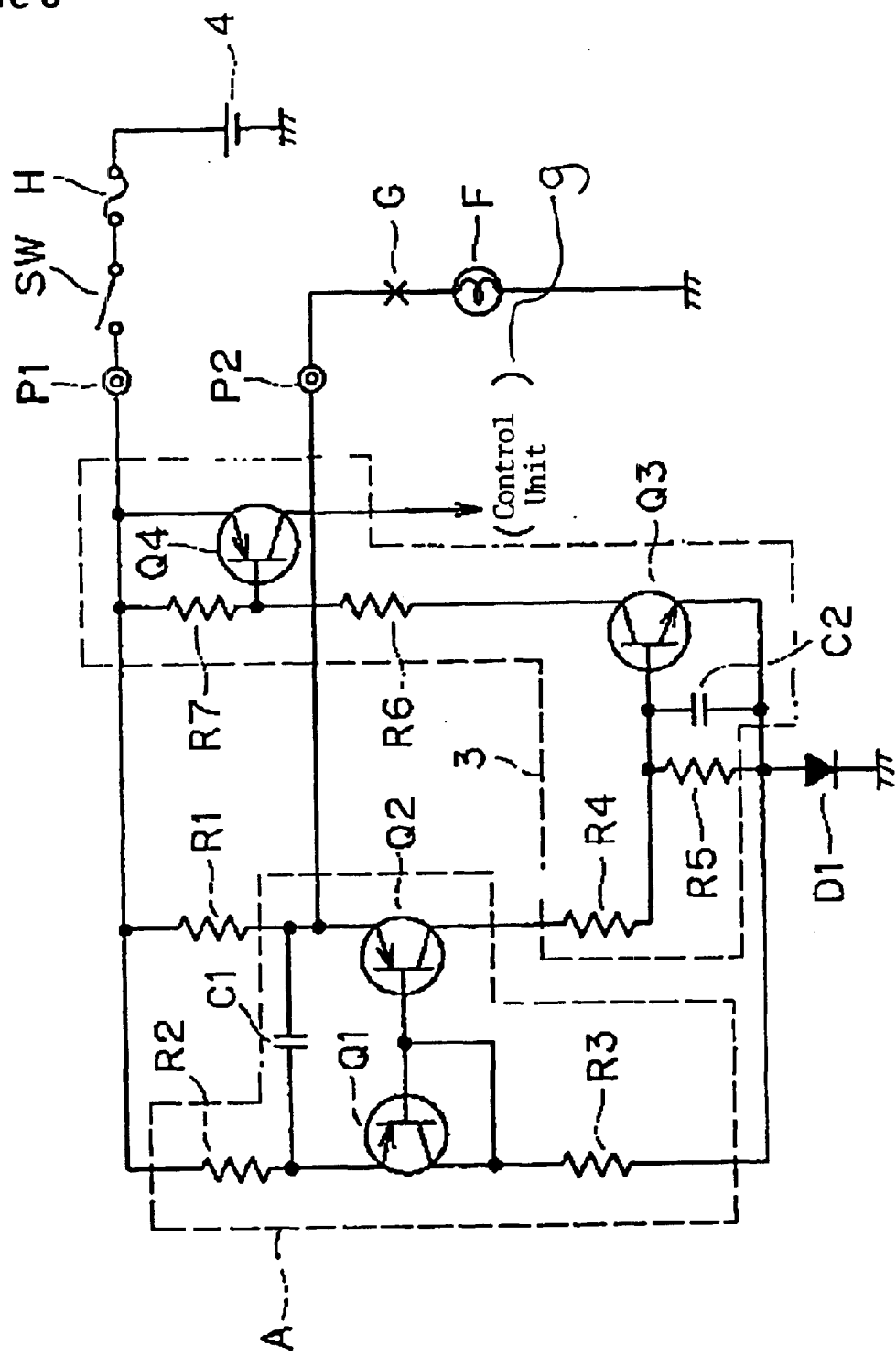
FIG. 6 is a circuit diagram showing main portions of the disconnection detection apparatus shown in FIG. 5.

FIG. 3 is a schematic view showing the construction of a disconnection detection apparatus according to a second embodiment of the present invention. FIG. 4 is a circuit diagram showing main portions of the disconnection detection apparatus shown in FIG. 3.

In the first embodiment, the warning lamp 5 is turned on by the same lighting operation in both cases whether the detection is the normal disconnection or the open destruction of the detection resistor R1. However in the second embodiment, a load-lighting operation in the normal disconnection of the feeding path is different from a load-lighting operation in the open destruction of the detection resistor R1.

As shown in FIGS. 3 and 4, in addition to the component parts of the disconnection detection apparatus 1A, a disconnection detection apparatus 1B has a pair of terminals P3 and P4 connected to a feeding path 11. A detection resistor R1' is connected between the terminals P3 and P4. A detection part (third detection part) C detects a disconnection of a feeding path 2 according to a decrease of a voltage drop at the detection resistor R1' compared with a voltage drop the detection resistor R1' during a normal operation. A detection part (fourth detection part) D detects an open destruction of the detection resistor R' according to an increase of a voltage drop at the detection resistor R1' compared with the voltage drop at the detection resistor R1' during normal operation. A determination part 13 determines whether the disconnection has occurred, based on a detection result supplied by the detection part C. A control part 15 controls a driving part 7 based on a determination result supplied by the determination part 13.

In the disconnection detection apparatus 1B, the terminals P1 and P2 are connectedly interposed between a brake switch SW1 and a stop lamp F1 of the feeding path 2. The feeding path 2 has a power supply 4, a fuse H1, the brake switch SW1, and the stop lamp (load) F1 connected in series with one another. The terminals P3 and P4 are connectedly interposed between a tail switch SW2 and a tail lamp F2 of the feeding path 11. The feeding path 11 has the power supply 4, a fuse H2, the tail switch SW2, and the tail lamp (load) F2 connected in series with one another.

In the disconnection detection apparatus 1B, as shown in FIG. 3, a detection result of the detection part B is not sent to the determination part 3 but to the determination part 13. Thus, the determination part 13 determines whether the open destruction has occurred at the detection resistor R1. On the other hand, a detection result of the detection part D is not sent to the determination part 13 but to the determination part 3. Thus, the determination part 3 determines whether the open destruction has occurred at the detection resistor R1'.

As shown in FIG. 4, the detection resistor R1', the detection parts C and D, and the determination part 13 are similar to the detection resistor R1, the detection parts A and B, and the determination part 3 of the first embodiment in the construction, respectively. In correspondence to the above-described construction, the collector of the transistor Q5 of the detection part B is not connected to the base of the transistor Q3 of the determination part 3, but to the base of transistor Q3' of the determination part 13. On the other hand, the collector of the transistor Q5' of the detection part D is not connected to the base of the transistor Q3' of the determination part 13, but to the base of transistor Q3 of the determination part 3. In FIG. 4, the constituent parts of the detection parts C and D and the determination part 13 are denoted by affixing a prime to the reference numerals of the detection parts C and D and the determination part 13.

When electric current is applied to the control part 9 from the determination part 3, with an ignition switch IG ON, the control part 9 keeps the warning lamp 5 ON through the driving part 7 for a time period from the time when the electric current is applied thereto until the ignition switch IG is turned off. In this case, when the switches SW1 and SW2 are turned off and the electric current supplied by the power supply as a result of a determination is stopped, the control part 9 does not turn off the warning lamp 5.

When the electric current supplied by the power supply is applied to the control part 15 from the determination part 13, with an ignition switch IG ON, the control part 15 turns on the warning lamp 5 through the driving part 7 at only the application time of the electric current. In this case, when the switches SW1 and SW2 are turned off and the electric current supplied as a result of a determination is stopped, the control part 15 turns off the warning lamp 5.

The operation of the disconnection detection apparatus 1B is described below. Let it be supposed that the ignition switch IG is ON. When the feeding path 2 has a disconnection, normal disconnection of feeding path 2, no voltage drop occurs in the detection resistor R1 when the brake switch SW1 is turned on. Therefore, the transistor Q2 is turned on, detection of disconnection of feeding path 2, with the transistor Q5 kept off, and electric current supplied by the power supply 4 flows to the ground through the detection resistor R1, the transistor Q2, the resistors R4 and R5, and the diode D1. Thereafter, the transistor Q3 is turned on, determination part 3 determines that disconnection has occurred in feeding path 2, due to a voltage drop at the transistor Q5 caused by the flow of the electric current therethrough, and the transistor Q4 is turned on. Then the electric current supplied, as a result of a determination that disconnection has occurred in feeding path 2, by the power supply 4 is sent to the control part 9 through the transistor Q4. The control part 9 controls the driving part 7 so that the warning lamp 5 is turned on until an operation of turning off the brake switch SW1 is performed. In this case, when the brake switch SW1 is turned off, the warning lamp 5 is not turned off.

When an open destruction occurs at the detection resistor R1, and the brake switch SW1 is turned on, the upstream end of the detection resistor R1 is set to the electric potential of the power supply and the downstream end of the detection resistor R1 is kept at the electric potential of the ground. Thus, with the difference in the potential between both ends of the detection resistor R1 kept at a voltage equivalent to the supply voltage, the transistor Q5 is turned on, indicating detection of open destruction of detection resistor R1. Thus, the electric current supplied by the power supply 4 flows to the ground through the diode D2, the transistor Q5, the resistor R5, and the diode D1. The transistor Q3' is turned on, determination part 13 determines that open destruction has occurred, due to a voltage drop at the resistor R5' caused by the flow of the electric current therethrough. The transistor Q4' is turned on and the electric current, supplied as a result of determination that open destruction has occurred, supplied by the power supply 4 is fed to the control part 15 through the transistor Q4'. Upon receipt of the electric current, the control part 15 drives the driving part 7 so that the driving part 7 turns on the warning lamp 5 at only the application time of the electric current, only when the brake switch SW1 is on. In this case, when the brake switch SW1 is turned off, the warning lamp 5 is turned off.

Similarly, when the feeding path 11 has a disconnection in the electric wiring at a downstream side of terminal P4, and the tail switch SW2 is turned on, the detection part C detects the disconnection of the feeding path 11. Then the determination part 13 determines that the disconnection has occurred in the feeding path 11. Thereafter the control part 15 turns on the warning lamp 5 only during the time period in which the tail switch SW2 is on. When the open destruction has occurred at the detection resistor R1 and the tail switch SW2 is turned on, the destruction part D detects the open destruction. The determination part 3 determines that the open destruction has occurred. The control part 9 turns on the warning lamp 5 until the ignition switch IG is turned off. In this case, when the tail switch SW2 is turned off, the warning lamp 5 is not turned off.

According to the disconnection detection apparatus 1B having the above-described construction, when the detection part A (C) detects the normal disconnection of the feeding path 2 (11), the control part 9 (15) turns on the warning lamp 5 by the predetermined lighting operation. When the detection part B (D) detects the open destruction of the detection resistor R1 (R1'), the control part 15 (9) turns on the warning lamp 5 by another predetermined lighting operation. That is, the warning lamp-lighting operation to be performed in the case where the normal disconnection of the feeding path 2 (11) is detected is different from the warning lamp-lighting operation to be performed in the case where the open destruction of the detection resistor R1 (R1') is detected. Owing to the difference in the warning lamp-lighting operations, the disconnection of the feeding path 2 (11) can be distinguished from the open destruction of the detection resistor R1 (R1').

Further the control part 9 is used to control the lighting of the warning lamp 5 in the case where the detection part A detects the normal disconnection of the feeding path 2 and also the lighting of the warning lamp 5 in the case where the detection part D detects the open destruction of the detection resistor R1'. Similarly the control part 15 is used to control the lighting of the warning lamp 5 in the case where the detection part B detects the open destruction of the detection resistor R1 and also the lighting of the warning lamp 5 in the case where the detection part C detects the normal disconnection of the feeding path 11. Therefore it is possible to reduce the number of component parts. It is also possible to make the disconnection detection apparatus 1B compact and manufacture the disconnection detection apparatus 1B at a lower cost.

Furthermore the disconnection detection apparatus 1B has the switch SW1 to turn on and off the load current to be supplied to the load F1 from the power supply 4. The switch SW2 turns on and off the load current to be supplied to the load F2 from the power supply 4. Thus in the case where the normal disconnection of the feeding path 2 from the load F1 has occurred or the open destruction has occurred in the detection resistor R1, the lighting of the warning lamp 5 is controlled by the control part 9 or the control part 15 in the different lighting operations in correspondence to the disconnection or the open destruction when the switch SW1 is on. In the case where the normal disconnection of the feeding path 11 from the load F2 has occurred or the open destruction has occurred in the detection resistor R1', the lighting of the warning lamp 5 is controlled by the control part 9 or the control part 15 in the different lighting operations in correspondence to the disconnection or the open destruction when the switch SW2 is on. That is, when the switch SW1 or the switch SW2 is turned on, the warning lamp 5 has a different lighting operation. Therefore it is possible to distinguish the disconnection of the feeding path from the load F1 and the disconnection of the feeding path from the load F2 from each other. It is also possible to distinguish the open destruction of the detection resistor R1 and the open destruction of the detection resistor R1' from each other.

According to the invention, the disconnection detection apparatus has the first detection resistor capable of detecting the disconnection of the first feeding path and the second detection part capable of detecting the open destruction of the first detection resistor according to an increase of the voltage drop at the first detection resistor compared with the voltage drop threat during normal operation. Therefore it is possible to detect the open destruction which has occurred at the first detection resistor.

According to the invention, when the first detection part detects the disconnection, the first control part turns on the warning lamp by the predetermined lighting operation. When the second detection part detects the open destruction, the second control part turns on the warning lamp by another predetermined lighting operation. That is, the warning lamp-lighting operation to be performed in the case where the disconnection of the feeding path is detected is differentiated from the warning lamp-lighting operation to be performed in the case where the open destruction of the detection resistor is detected. Thereby the disconnection of the feeding path can be distinguished from the open destruction of the detection resistor.

According to the invention, the first control part is used to control the lighting of the warning lamp in the case where the first detection part detects the normal disconnection of the first feeding path and also the lighting of the warning lamp in the case where the third detection part or the fourth detection part detects the disconnection of the second feeding path or the open destruction of the second detection resistor. Similarly the second control part is used to control the lighting of the warning lamp in the case where the second detection part detects the open destruction of the first detection resistor and also the lighting of the warning lamp in the case where the third detection part or the fourth detection part detects the disconnection of the second feeding path or the open destruction of the second detection resistor. Therefore it is possible to reduce the number of component parts. Thus it is possible to make the disconnection detection apparatus 1B compact and manufacture the disconnection detection apparatus 1B at a lower cost.

According to the invention, the disconnection detection apparatus has the first switch for turning on and off the load current to be supplied to the first load from the power supply and the second switch for turning on and off the load current to be supplied to the second load from the power supply. Thus in the case where the disconnection of the first feeding path from the first load has occurred or the open destruction has occurred in the first detection resistor, the lighting of the warning lamp is controlled by the first control part or the second control part in the different lighting operations corresponding to the disconnection or the open destruction when the first switch is on. In the case where the disconnection of the second feeding path from the second load has occurred or the open destruction has occurred in the second detection resistor, the lighting of the warning lamp is controlled by the first control part or the second control part in the different lighting operations corresponding to the disconnection or the open destruction when the second switch is on. Thus, when the first switch or the second switch is turned on, the warning lamp has a different lighting operation. Therefore it is possible to distinguish the disconnection of the feeding path from the first load and the disconnection of the feeding path from the second load from each other. It is also possible to distinguish the open destruction of the first detection resistor and the open destruction of the second detection resistor from each other.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A disconnection detection apparatus comprising:
   a first detection resistance connectedly mounted on a first feeding path extending from a power supply to a first load;
   a first detection part "couple across the first detection resistance, and operable to detect" a disconnection of said first feeding path according to a decrease of a voltage drop at said first detection resistance in comparison with a voltage drop said first detection resistance in a normal operation;

a second detection part coupled across the first detection resistance and operable to detect an open circuit across the first detection resistance according to an increase of said voltage drop at said first detection resistance in comparison with said voltage drop said first detection resistance in a normal operation;

a warning lamp;

a first control part for controlling lighting of said warning lamp by a first predetermined lighting operation when said first detection part detects said disconnection; and a second control part for controlling lighting of said warning lamp by a second predetermined lighting operation when said second detection part detects said open destruction;

the first or second predetermined lighting operation including turning on the warning lamp when a switch of the first load is in a closed state and turning off the warning lamp when the switch of the first load is in an open state.

2. A disconnection detection apparatus according to claim 1, further comprising:

a second detection resistance connectedly mounted on a second feeding path extending from said power supply to a second load;

a third detection part detecting a disconnection of said second feeding path according to a decrease of a voltage drop at said second detection resistance in comparison with a voltage drop said second detection resistance in a normal operation; and a fourth detection part detecting an open destruction of said second detection resistance according to an increase of said voltage drop at said second detection resistance in comparison with said voltage drop at said second detection resistance in a normal operation, wherein said first control part executes a control of turning on said warning lamp by said first predetermined lighting operation, when said first detection part detects said disconnection of said first feeding path, and said first control part executes said control of turning on said warning lamp by said first predetermined lighting operation, when said third detection part or said fourth detection part detects said disconnection of said second feeding path or said open destruction of said second detection resistance; and said second control part executes a control of turning on said warning lamp by said second predetermined lighting operation, when said second detection part detects said open destruction of said first detection resistance, and said second control part executes said control of turning on said warning lamp by said second predetermined lighting operation, when said third detection part or said fourth detection part detects said disconnection of said second feeding path or said open destruction of said second detection resistance.

3. A disconnection detection apparatus according to claim 2, further comprising:

a first switch for turning on and off a load current to be supplied to said first load from said power supply; and a second switch for turning on and off a load current to be supplied to said second load from said power supply.

4. A disconnection detection apparatus according to claim 2, wherein the first or second predetermined lighting operation includes turning on the warning lamp when a switch of the second load is in a closed state and turning off the warning lamp when the switch of the second load is in an open state.

* * * * *

UNITED STATES PATENT AND TRADEMARK OFFICE
CERTIFICATE OF CORRECTION

PATENT NO. : 6,956,377 B2
DATED : October 18, 2005
INVENTOR(S) : Hiroaki Masaoka It is certified that error appears in the above-identified patent and that said Letters Patent is hereby corrected as shown below:

<u>Title page,</u>
Item [73], should read:
-- [73] Assignee: Sumitomo Wiring Systems, Ltd., Mie (JP) --.

Signed and Sealed this

Seventh Day of February, 2006

JON W. DUDAS
*Director of the United States Patent and Trademark Office*